United States Patent [19]
Speiser et al.

[11] Patent Number: 5,454,725
[45] Date of Patent: Oct. 3, 1995

[54] CIRCUIT CARD WITH LOW PROFILE DETACHABLE INTERFACE

[75] Inventors: Benjamin T. Speiser, San Francisco; Lloyd N. Oliver, Milipitas, both of Calif.

[73] Assignee: 3COM Corporation, Santa Clara, Calif.

[21] Appl. No.: 163,255

[22] Filed: Dec. 7, 1993

Related U.S. Application Data

[63] Continuation-in-part of Ser. No. 8,446, May 17, 1993, Pat. No. Des. 353,799, and Ser. No. 8,524, May 17, 1993, Pat. No. Des. 354,940, and Ser. No. 8,376, May 17, 1993, Pat. No. Des. 354,271, and Ser. No. 8,375, May 17, 1993, Pat. No. Des. 353,796, and Ser. No. 8,481, May 17, 1993, Pat. No. Des. 354,732.

[51] Int. Cl.⁶ .................................................. H01R 9/09
[52] U.S. Cl. ............................. 439/61; 439/608; 361/785; 333/124
[58] Field of Search ............................ 361/736, 748, 361/752, 784, 785, 792; 439/55, 59–61, 79, 80, 607, 608; 333/100, 124, 125, 129

[56] References Cited

U.S. PATENT DOCUMENTS

| | | | |
|---|---|---|---|
| 4,573,753 | 3/1986 | Vogl | 439/61 X |
| 4,582,374 | 4/1986 | Conrad et al. | 439/61 |
| 4,874,317 | 10/1989 | Lau | 439/61 X |
| 5,117,331 | 5/1992 | Gebara | 361/785 X |
| 5,163,833 | 11/1992 | Olsen et al. | 439/61 |
| 5,174,770 | 12/1992 | Sasaki et al. | 439/608 X |
| 5,261,829 | 11/1993 | Fusselman et al. | 439/608 X |
| 5,291,072 | 3/1994 | Hihara | 361/785 X |
| 5,305,182 | 4/1994 | Chen | 361/785 X |

*Primary Examiner*—Khiem Nguyen
*Attorney, Agent, or Firm*—Townsend and Townsend and Crew

[57] ABSTRACT

An adapter and control card system for a digital computer is provided for coupling the digital computer to a selectable choice of communications media. The system includes a general-application host card removably insertable into the digital computer, and a communications-medium-specific adapter card removably insertable into the host card, the host card having a cutout conforming to side and end boundaries of said adapter card, the adapter card fitting within the cutout along a substantially common plane in order to minimize surface height of the adapter card and the host card. Mating connectors, particularly between the adapter card and the host card, form transmission lines taking full advantage of ground pins adjacent to signal-carrying differential pairs shielding the signals with a controlled characteristic impedance. In a specific embodiment, the support structure for the connectors also forms the mechanical support for the adapter card and the host card.

15 Claims, 4 Drawing Sheets

CIRCUIT CARD WITH LOW PROFILE DETACHABLE INTERFACE

CROSS REFERENCE TO RELATED APPLICATIONS

The application is a continuation in part application of Design patent application Ser. No. 29/008,446 filed May 17, 1993, now U.S. Pat. No. 353,799, Design patent application Ser. No. 29/008,524, filed May 17, 1993, now U.S. Pat. No. 354,940, Design patent application Ser. No. 29/008,376, filed May 17, 1993 now U.S. Pat. No. 354,271, Design patent application Ser. No. 29/008,375, filed May 17, 1993 now U.S. Pat. No. 353,796, and Design patent application Ser. No. 29/008,481, filed May 17, 1993, now U.S. Pat. No. 354,732.

BACKGROUND OF THE INVENTION

This invention relates to adapter card technology, particularly for personal computers used in connection to a local area network. More particularly, this invention relates to a card removably insertable into a personal computer for use in providing a first layer or type of access control in connection with a variety of communication media, including unshielded twisted pair wire., shielded twisted pair wire, coaxial cable, fiber optic cable, infrared communications and wireless radio communication.

Network interface cards for local area networks provide two functions: an interface to a communication medium and control of access between the communication medium and the host computer. These functions heretofore have not been physically separable within the space constraints imposed by the allowable card separation spacing within common personal computers. Standards, such as the ISA bus standard and the EISA bus standard, limit the distance allowed between card connectors within a computer case. Hence, prior attempts at providing media independent access to the control functions have required multiple slots or external connection to media adapters.

What is needed is an adapter and control card system which is of sufficiently low profile to conform to the constraints imposed by the space limitations of personal computer slot spacing.

SUMMARY OF THE INVENTION

According to the invention, an adapter and control card system for a digital computer is provided for coupling the digital computer to a selectable choice of communications media. The system includes a general-application host card removably insertable into the digital computer, and a communications-medium-specific adapter card removably insertable into the host card, the host card having a cutout conforming to side and end boundaries of said adapter card, the adapter card fitting within the cutout along a substantially common plane in order to minimize surface height of the adapter card and the host card. Mating connectors, particularly between the adapter card and the host card, form transmission lines taking full advantage of ground pins adjacent to signal-carrying differential pairs shielding the signals with a controlled characteristic impedance. In a specific embodiment, the support structure for the connectors also forms the mechanical support for the adapter card and the host card.

The invention will be understood upon reference to the following detailed description in connection with the accompanying drawings.

DETAILED DESCRIPTION OF SPECIFIC EMBODIMENTS

Figure 1:
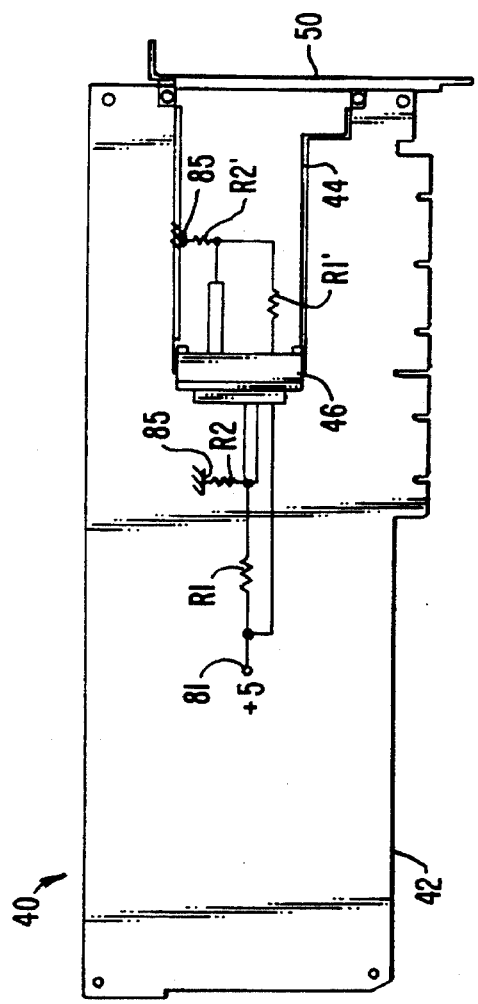
FIG. 1 is a perspective view of a host card and adapter card mounted together illustrating an in-line connector.

Referring to FIG. 1, there is illustrated a system 40 according to the invention. The system 40 includes a general-application host card 42 that is removably insertable into a digital computer (not shown) and a communications-medium-specific adapter card 44 that is removably insertable into the host card 42. The host card 42 is configured so that the adapter card 44 may be inserted into the host card 42 along a substantially common plane in order to minimize surface height of the adapter card 44 and the host card 42. The system 40 also includes mating connectors 46 between the adapter card 44 and the host card 42 allowing for signals to be transmitted between the adapter card 44 and the host card 42. In a preferred embodiment, the mating connectors 46 also form mechanical support for the adapter card 44 and the host card 42.

The adapter card 44 is designed so that a plurality of different media connections may be used with the computer system. Acceptable media connections include: Level 5 unshielded twisted pair (UTP), implementing a CDDI emerging standard; fiber optic; co-axial cable; wireless; infrared; FDDI; ST; Single Mode Fiber; STP, including "Gang of Five" and SDDI; and the like. The availability of a choice of media connections allows a user to easily upgrade from one media to another without having to discard existing or acquire new system elements which are medium independent. For instance, a user could upgrade from a UTP connection to a fiber optic connection without having to replace the host card 42 and its associated controller. Instead, only a new adapter card 44 having a fiber optic media connection would need to be acquired.

Figure 2:
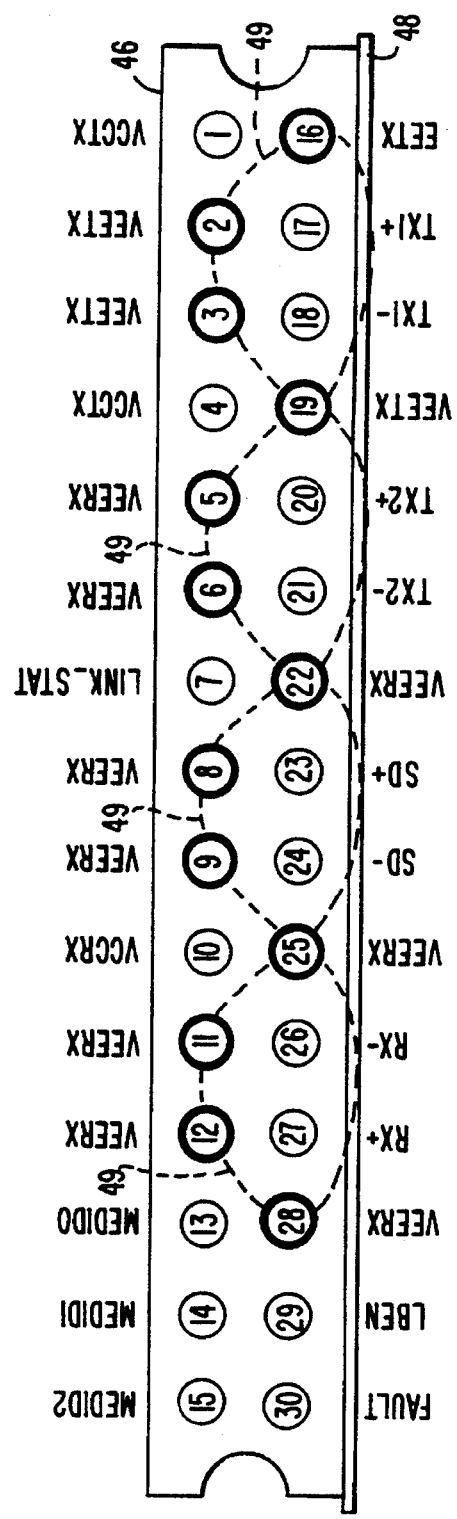
FIG. 2 is a front view of a connector showing the location of signal-carrying differential pairs of pins and adjacent grounded pins forming a short shielded transmission line.

As shown in FIG. 2, the coplanar configuration of the adapter card 44 and the host card 42 allows for pairs of high frequency differential signal-carrying pins 17, 18, 20, 21, 23, 24, 26, 27 having data rates of about 125 MBPS between the adapter card 44 and the host card 42. The pairs of differential signal-carrying pins 17, 18, 20, 21, 23, 24, 26, 27 are housed within the mating connectors 46 and are shown grouped together in FIG. 2. The signal-carrying pins 17, 18, 20, 21, 23, 24, 26, 27 are also surrounded by signal ground pins 16, 2, 3, 19, 5, 6, 22, 8, 9, 25, 11, 12, 28 (which are shown bolded in FIG. 2), and by a ground plane 48 that is attached to the connector 46 to form ground shields 49. The specific configuration of the ground pins 16, 2, 3, 19, 5, 6, 22, 8, 9, 25, 11, 12, 28 and ground plane 48 as shown is necessary in order to form a high frequency rf shield around the pairs of differential-signal carrying pins 17, 18, 20, 21, 23, 24, 26, 27 allowing for high fidelity signals to be transmitted between the adapter card 44 and the host card 42. Specifically, the pairs of differential signal-carrying pins 17, 18, 20, 21, 23, 24, 26, 27 are surrounded by grounded pins, and specifically by ground pins 16, 2, 3, 19, 5, 6, 22, 8, 9, 25, 11, 12, 28, which effectively form ground shields 49 to help maintain a desired characteristic impedance across the connectors 46. In one embodiment, the length of the differential signal-carrying pins 17, 18, 20, 21, 23, 24, 26, 27 through the connector 46 is about ⅜ inches.

A further reason for configuring the adapter card 44 and the host card 42 in a coplanar fashion is to allow for the use of industry accepted standard media connections such as a RJ-45 connector, a DB-9 connector, or the like, without violating the component height constraints of adapter specifications. These specifications include the EISA (Extended Industry Standard Architecture) and the ISA (Industry Standard Architecture) mechanical constraints. Since both the adapter card 44 and the host card 42 are in the same plane, such industry height requirements may be satisfied.

All electrical signals required for operation of the adapter card 44 pass through the connecter 46. For illustrative purposes, inputs and outputs of the electrical signals are relative to the adapter card 44, i.e., an "output" is a signal that originates on the adapter card 44 and terminates at an input to some device on the host card 42.

Referring again to FIG. 2., one particular embodiment of the invention provides for signal-carrying pins 26 and 27 which are designated as RDH/L (Receive Data High/Low) Signal Data output pins and are used to output a 125 MBPS stream of NRZI recovered data using differential 100K Pseudo Emitter Coupled Logic (PECL) level signals. RDH High and RDL Low together correspond to a logic one in the differential pair. Signal-carrying pins 17 and 18 are designated as TDH/L Transmit Data High/Low) Serial Data input pins and are used to input a 125 MBPS stream of NRZI data to be transmitted using differential 100K PECL level signals. TDH High and TDL Low together correspond to a positive pulse. Signal-carrying pins 20 and 21 are designated as TX2H/L Transmit Serial Data input pins and are auxiliary pins provided in the adapter card interface connector 46 to accommodate a three level signaling scheme (such as MLT-3) for transmission over unshielded twisted pair. Signal-carrying pins 20 and 21 are further intended for differential 100K PECL signals. Signal-carrying pins 23 and 24 are designated as SDH/L (Signal Detect High/Low) output pins and provide an indication of acceptable receive signal amplitude and cable continuity using differential 100K PECL signals. SDH High and SDL Low indicate that both conditions (signal level and cable continuity) are satisfied. For a fiber-optic connector, assertion of SDH/L indicates adequate receive level only. Lines corresponding to signal-carrying pins 13–15 are designated as MEDID[0 . . . 2] Media Identification output pins and provide a code that uniquely identifies the type of adapter card 44 connected to the host card 42. In this particular embodiment, seven of eight possible codes are assigned:

0h=MIC fiber-optic adapter card
1h=ST fiber optic adapter card
2h=low-cost fiber optic adapter card
3h=Single mode fiber-optic adapter card
4h=STP adapter card
5h=UTP adapter card
6h=not defined
7h=invalid code (no adapter card installed).

The function of these codes will be discussed more fully following. Signal-carrying line 29 is designated as LBEN Loop-back Enable input pin and provides PMD loop-back for diagnostic purposes with twisted-pair receivers only. When LBEN is high, data appearing on TDH and TDL will be routed to RDH and RDL respectively. Signal-carrying pin 30 is designated as Fault input pin and controls a fault status (yellow) light emitting diode (LED) indicator 86 mounted on an end plate 50 (shown in FIGS. 1 and 4A–4E and discussed below). When FAULT is high, the LED 86 will light, indicating a fault condition. The fault signal does not inhibit the flow of data into or out of the adapter card 44, nor does it inhibit the operation of an "activity" LED 86. However, a cable fault will cause the yellow LED to flash regardless of the state of the FAULT signal. Signal carrying pin 7 is designated as LINK_STAT Link Status output pin and is a CMOS output indicating cable continuity in a twisted pair connection. When LINK_STAT is high, a phantom current of the minimum magnitude and correct polarity has been detected, indicating cable continuity.

Figure 3:
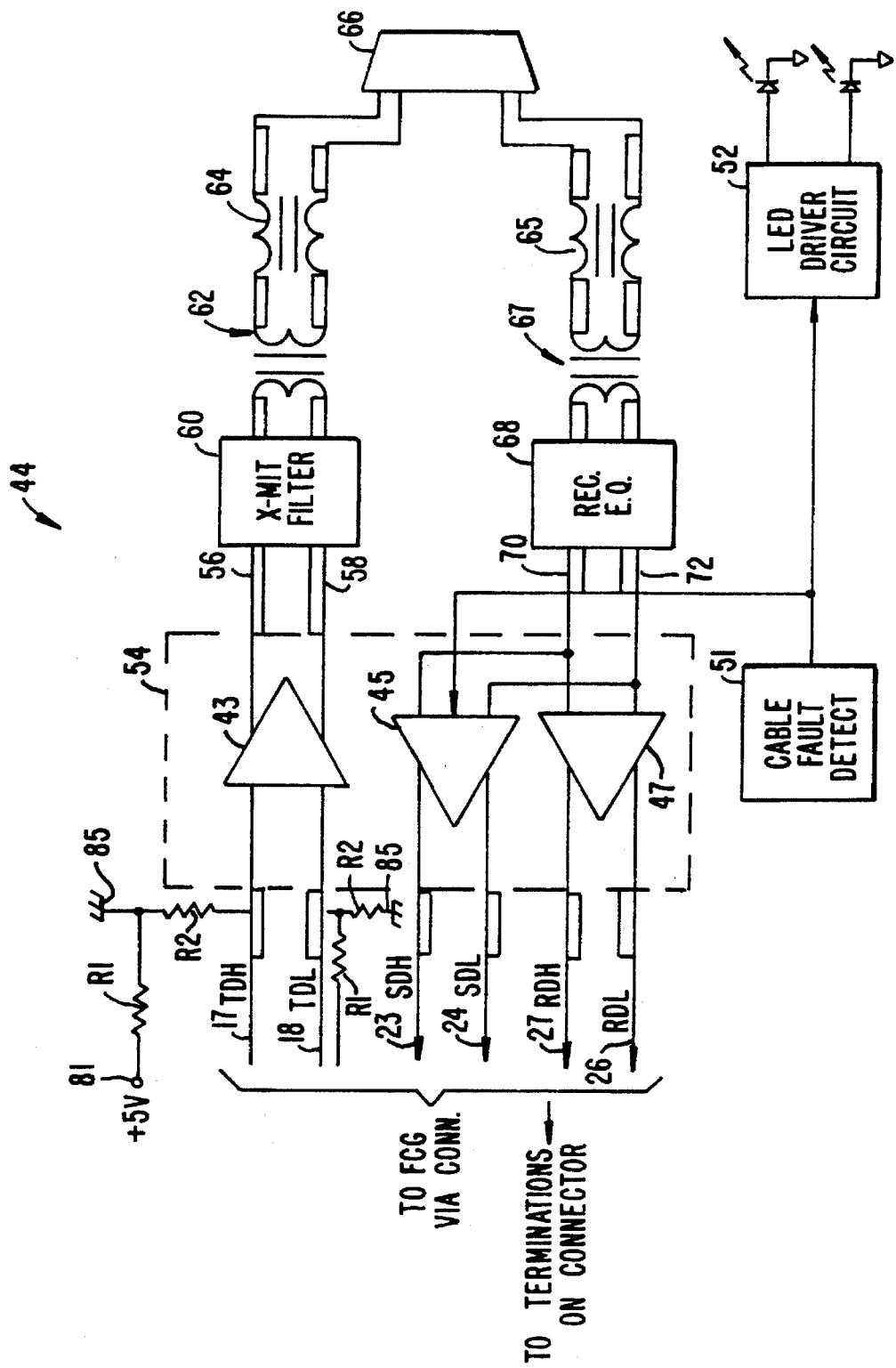
FIG. 3 is a circuit diagram of one combination of adapter card and host card illustrating transceivers and signaling according to the invention.

Referring now to FIG. 3, the circuit diagram of one combination of adapter card 44 and host card 42 is shown illustrating transceivers and signalling according to the invention. Shown is a transmit data path and a receive data path and two subcircuits 51 and 52 for cable fault detection and for LED driver logic. The transmit data path begins with data appearing on the transmit data pair 17 and 18 that originate in a FCG IC (not shown) on the host card 42. These differential data signals along microstrip lines as hereinafter explained pass through a transconductance receive differential amplifier 43 in a type DP83220 IC 54 (shown in phantom) and exit through lines TXO+/– 56 and 58. The amplified signal then passes through a two-pole, low-pass transmit filter 60 to reduce high-frequency harmonics. The filtered signal then passes through an isolation transformer 62 and common mode choke 64 before reaching a media connector 66. Through the media connector 66, connection is made to a twisted-pair network cable (not shown).

Data signals received over the network cable via the connector 66, pass through choke 65, transformer 67, and a receive equalizer 68, before reaching the input pins RXI+/– 70 and 72 of the DP83220 IC 54. Inside the DP83220 IC 54, the input signals are amplified to 100K ECL levels by differential transmitter amplifiers 45, 47 before passing to the output pins, PMID+/– 27 and 26. If the output signals are greater in amplitude than the internally set squelch level of the DP83220 IC 54, and the CDET cable detect signal line is driven to a logic zero (indicating cable continuity), then the Signal Detect Lines, SD+/– 23 and 24 will be asserted indicating valid data at the PMID pins 74 and 76. Both the PMID and SD output of the DP83220 IC 54 pass through the transceiver interface connector 46 to connect to the FCG IC on the host card 42.

Referring to FIGS. 4A–4E, an exemplary adapter card 44 for the system 40 further includes mounted thereto an end plate 50 that is used both to brace the media connection 80 and to support the adapter card 44 against the host card 42. The particular media connection 80 shown in FIGS. 4A–4E is a DB-9 standard media connection that is well accepted in the industry. However, the end plate 50 is not limited to supporting only a DB-9 connection, but to all industry accepted media connections such as RJ-45 connectors, fiber optic connectors, BNC connectors, and the like. Of course, the adapter card 44 is merely one example of a variety of possible adapter cards, all of which have in common a height profile within the standard spacing requirements.

The media connection 80 is electrically coupled and preferably attached to the adapter card 44 by conventional means known in the art. The mating end of media connection 80 extends through a slot in the end plate 50 so that a mating external media coupling (not shown) may interface with the media connection 80. The media connection 80 is securely fastened to the end plate 50 by any conventional means known in the art such as with a pair of screws, a weld, an adhesive, or the like, so that the media connection 80 is rigidly supported when interfaced with a mating media connection.

Figure 4A:
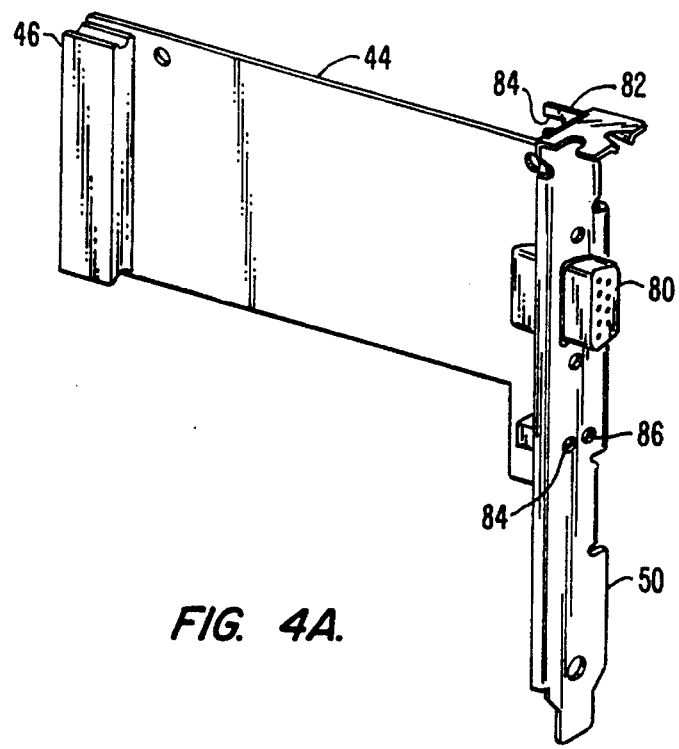
FIG. 4A is a perspective view of an end plate support attached to an adapter card according to the invention.
Figure 4B:
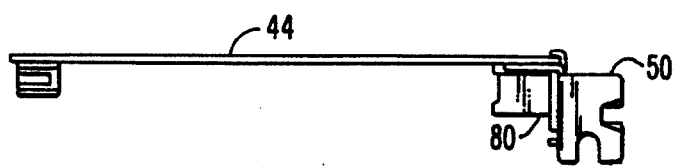
FIG. 4B is a top plan view of an end plate support attached to an adapter card according to the invention.
Figures 4C, 4D, 4E:
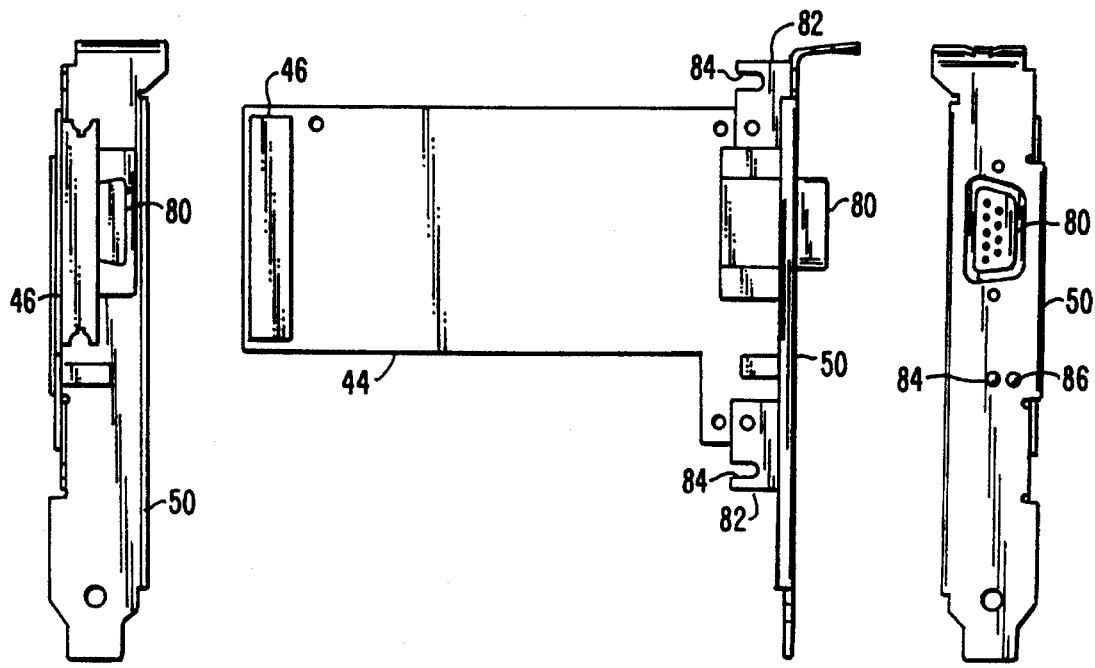
FIG. 4C is a front plan view of an end plate support attached to an adapter card according to the invention.
FIG. 4D is a left side plan view of an end plate support attached to an adapter card according to the invention.
FIG. 4E is a right side plan view of an end plate support attached to an adapter card according to the invention.

As best shown in FIG. 4C, the end plate 50 also has tabs 82 at each end to support the adapter card 44 against the host card 42. As shown, the end plate is attached to the adapter card 44. In the preferred embodiment, such attachment is effected by placing a screw through the adapter card 42 and into a hole in the end plate 50. However, the end plate 50 may be attached to the adapter card in other ways such as with as with an adhesive and is not limited to the use of screws.

The tabs 82 are fashioned so that they have a mounting slot or groove 84 that mates or interengages with a mounting screw (not shown), a post, or the like extending from the host card 42 when the adapter card 44 is inserted into the host card 42. When the adapter card 44 and the host card 42 are connected, a device such as a nut, a clamp, or the like may be used to securely fasten the end plate 50 to the host card 42 so that the host card 42 and the adapter card 44 are securely positioned in a coplanar manner. In the preferred embodiment, a screw, connected to the host card 42 by a nut, is used to interengage with the tabs 82. After interengagement, the nut is rotated to securely fasten the end plate, and hence the adapter card 44, to the host card 42 in a coplanar manner.

Once the adapter card 44 is securely fastened to the host card 42, the host card 42 is inserted into a host digital computer, printer, server, or the like (not shown). After insertion, the media connection 80 that is attached to the adapter card 44, and to the host card 42 via the end plate 50, is securely braced to the casing (not shown) of the host digital computer.

End plate 50 may also have two holes where two light emitting diode (LED) indicators 84 and 86 are mounted. These are visible from the rear of a personal computer enclosure when the connected host card 42 and adapter card 44 are installed. The LEDs report hardware states for the user as discussed above.

Figure 5:
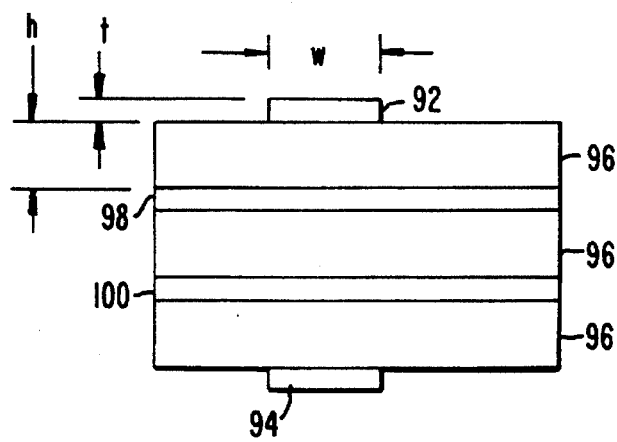
FIG. 5 is a cross section of a microstrip transmission line built into the adapter card.

FIG. 5, in conjunction with FIG. 1 and FIG. 3, illustrates the geometry of the microstrip transmission lines 92 and 94 on the component side and the solder side, respectively, that are built into the adapter card 44. The transmission lines 92 and 94 providing the transmit and receive data paths that connect the adapter card 44 to the host card 42 must be able to handle high bits rates (125 MBPS) and fast rise times (typically 1 to 2 nS). Consequently, impedance of the microstrip transmission lines 92, 94 is matched on the adapter card 44 and the host card 42 for the TDH, TDL, RXH, RXL, SDH, and SDL transmission lines to correspond to the characteristic impedance of the connectors through pins 17, 18, 27, 26, 23, and 24, respectively. The characteristic impedance for these lines is nominally 50 Ω. The formula for such a characteristic impedance may be found in the *Motorola MECL System Design Handbook,* 1988, p. 178. Hence, each line trace of a receiver 41 is terminated on the host card 42 and each line trace of receiver 43 on the adapter card 44 is terminated on the adapter card 44 into a 50 Ω Thevenin equivalent termination. This is typically a standard termination for PECL. Specifically, termination is a 50 Ω Thevenin impedance with a 3 Volt Thevenin voltage. The values to achieve these Thevenin equivalents in a 5 Volt system are 80.6 Ω (R1) and 130 Ω (R2) forming a resistive divider between the Vcc power 81 and VEE ground 85 connections. However, other methods are available to achieve such an equivalent, and the invention is not limited to this method. On the media side of the DP83220 IC 54, i.e., pins TXO+/− 56 and 58, etc., differential pairs of 75 Ω line traces may be used to achieve a good match to the characteristic impedance of IBM Type 1 Cable (150 Ω).

As shown in FIG. 5, the 50 Ω microstrip lines 92 and 94 have a width w and a thickness t. The microstrip lines 92 and 94 are separated by a dielectric material 96, preferably made of FR-4 epoxy board, having a height h. Sandwiched between the two pieces of dielectric material are a ground line 98 and a power line 100 that are also separated by a piece of dielectric material. In the preferred embodiment, the desired thickness t is 0.0026 inches. The desired height of the FR-4 epoxy board is 0.010 inches with a dielectric constant of 4.65. The dielectric thickness and the relative permeability values are available from Westak Inc., Sunnyvale, Calif. From these values, the width w of the 50 Ω microstrip lines 92 and 94 may be determined by the formula:

$$ZO = \frac{87}{\sqrt{er + 1.41}} \ln \frac{5.98h}{0.8w + t}$$

Using this formula, the appropriate width w is 0.0149 inches.

A similar calculation may be performed for the 75 Ω microstrip line width for the lines on the media side of the DP83220 IC 54. This calculation gives a desired width w of 0.0057 inches.

The transmission lines 92 and 94 are typically in length from about 1 to 3 inches. The specific determination of the length of the transmission lines 92 and 94, however, depends on the particular circuit design.

Figure 6:
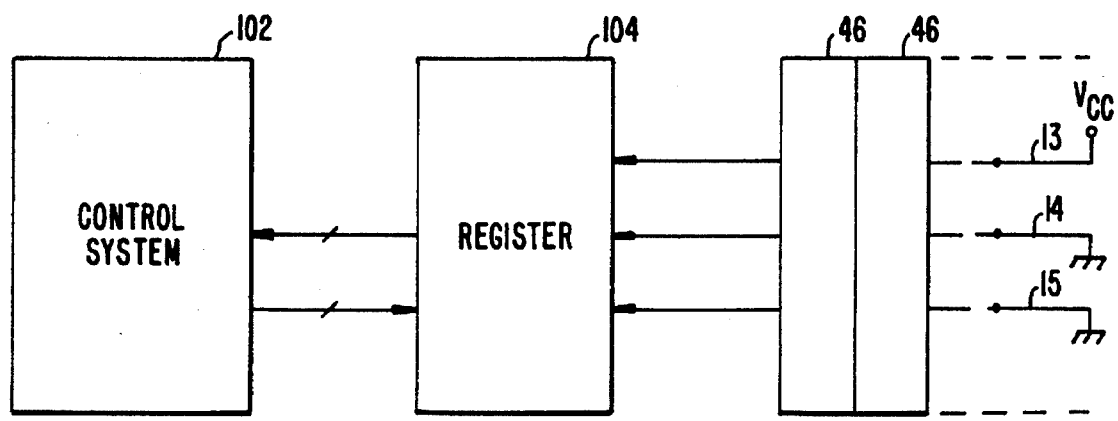
FIG. 6 is a block diagram illustrating the media identification technique according to the invention.

Referring now to FIG. 6, a block diagram illustrating the media identification technique is shown. As discussed in connection with FIG. 2, signal-carrying lines 13–15, are grounded or tied to a +5 Volt source to provide a code that uniquely identifies the type of adapter card 44 connected to the host card 42. The sets of three-bit media identification codes are stored in a register 104 on the host card 42. This code is read by a software driver that resides in the memory of the control system 102. The software queries the register 104 to see what type of adapter card 44 is attached. This is accomplished by decoding the three-bit media identification code. After decoding, the host card 42 is caused to be configured automatically to support the particular type of adapter card 44 to which it is connected, i.e., UTP, fiber optic, etc.

The invention has now been explained with reference to specific embodiments. Other embodiments will be apparent to those of ordinary skill in the art upon reference to this description. It is therefore not intended that this invention be limited, except as indicated by the appended claims.

What is claimed is:

1. An apparatus for a digital computer for coupling the digital computer to a selectable choice of communications media, said apparatus comprising:

a host card removably insertable into the digital computer; and a communications-media-specific adapter card selected from a variety of types of adapter cards, each corresponding to a specific choice of communications media for connection to a specific communications medium selected from said choice of communications media, said adapter card removably insertable into said host card, said adapter card having a first end, a second end opposing said first end, a top surface, a bottom surface, a first side and a second side;

said host card having a cutout conforming to side and end boundaries of said adapter card;

a first connector means, mounted adjacent said first end of said adapter card, for coupling communication signals associated with said adapter card to and from said specific communications medium;

a second connector means, mounted at the second end of said adapter card, for coupling electrical signals in a selected common format with said host card;

a third connector means, mounted to said host card in opposition to said second connector means, for coupling electrical signals with said adapter card;

means for supporting said adapter card and said host card in a rigid relationship in a substantially common plane in order to minimize surface height of said adapter card and said host card; and means on said host card for determining the type of said adapter card upon insertion of said adapter card into said host card.

2. The apparatus according to claim 1, wherein said adapter card is reciprocally insertable into said host card along said common plane such that said second connector means mates with said third connector means and forms a portion of said supporting means.

3. The apparatus according to claim 2, wherein said supporting means further includes an end plate for forming a casing shield and mounted to said adapter card, said end plate comprising means for bracing said first connector means in said computer and means for supporting said adapter card against said host card.

4. The apparatus according to claim 3, wherein said end plate includes integral tabs that are slidably insertable into connecting means on said host card for rigidly attaching said adapter card to said host card in a coplanar manner.

5. The apparatus according to claim 1, wherein said second connector means and said third connector means contain pairs of differential signal-carrying pins that are shielded by ground pins and a ground plane to maintain a characteristic impedance across said second connector means and said third connector means when said third connector means and said second connector means are mounted in opposition.

6. The apparatus according to claim 5, wherein said ground plane is patterned in a coplanar manner relative to said adapter card and said host card.

7. The apparatus according to claim 6, wherein said pairs of differential signal-carrying pins are straight.

8. The apparatus according to claim 7, wherein said pairs of differential signal-carrying pins are aligned parallel to said ground plane.

9. The apparatus according to claim 1, wherein pairs of differential signal-carrying pins couple the electrical signals associated with said adapter card to and from said host card.

10. The apparatus according to claim 1, wherein microstrip conductors transmit the electrical signals associated with said adapter card and said host card.

11. The apparatus according to claim 1, wherein the electrical signals associated with said adapter card and said host card comprise microstrip signals.

12. The apparatus according to claim 11, wherein said microstrip signals have an associated impedance that is matched with an impedance termination of said adapter card and said host card.

13. The apparatus according to claim 1, wherein said second connector means and said third connector means comprise a two-row connector having signal-carrying pairs of pins adjacent a ground plane, and ground pins at locations adjacent the signal-carrying pairs of pins.

14. The apparatus according to claim 1, wherein said determining means comprises a register on said host card for storing a three-bit communications media code identifying said type of adapter card.

15. An apparatus for a digital computer for coupling the digital computer to a selectable choice of communications media, said apparatus comprising:

a host card removably insertable into the digital computer; and an adapter card removably insertable into said host card, said adapter card having a first end, a second end opposing said first end, a top surface, a bottom surface, a first side and a second side;

said host card having a cutout conforming to side and end boundaries of said adapter card;

a first connector means, mounted adjacent said first end of said adapter card, for coupling communication signals associated with said adapter card to and from a communications medium;

a second connector means, mounted at the second end of said adapter card, for coupling electrical signals in a selected common format with said host card;

a third connector means, mounted to said host card in opposition to said second connector means, for coupling electrical signals with said adapter card;

means for supporting said adapter card and said host card in a rigid relationship in a substantially common plane in order to minimize surface height of said adapter card and said host card;

wherein said adapter card is reciprocally insertable into said host card along said common plane such that said second connector means mates with said third connector means and forms a portion of said supporting means; wherein said supporting means further includes an end plate for forming a casing shield and mounted to said adapter card, said end plate comprising means for bracing said first connector means in said computer and means for supporting said adapter card against said host card; and wherein said end plate includes integral tabs that are slidably insertable into connecting means on said host card for rigidly attaching said adapter card to said host card in a coplanar manner.

* * * * *